United States Patent [19]
Kahen

[11] Patent Number: 5,317,588
[45] Date of Patent: May 31, 1994

[54] RIDGE WAVEGUIDE DISTRIBUTED-FEEDBACK LASER DIODE WITH A DEPRESSED-INDEX CLADDING LAYER

[75] Inventor: Keith B. Kahen, Rochester, N.Y.

[73] Assignee: Eastman Kodak Company, Rochester, N.Y.

[21] Appl. No.: 971,648

[22] Filed: Nov. 5, 1992

[51] Int. Cl.$^5$ .............................................. H01S 3/086
[52] U.S. Cl. .......................................... 372/96; 372/45
[58] Field of Search ................................... 372/43–45, 372/96

[56] References Cited

U.S. PATENT DOCUMENTS

| | | | |
|---|---|---|---|
| 4,328,469 | 5/1982 | Scifres et al. | 372/45 |
| 4,575,919 | 3/1986 | Logan et al. | 372/43 X |
| 4,622,673 | 11/1986 | Tsang | 372/45 |
| 4,754,459 | 6/1988 | Westbrook | 372/96 X |
| 4,805,184 | 2/1989 | Fiddyment et al. | 372/96 |

OTHER PUBLICATIONS

Yuri et al., "Reduction of Beam Divergence Angles Perpendicular to the Junction Planes by Modulating the Refractive Index Profile in AlGaAs Laser Diodes", Japanese Society of Applied Physics, Fall 1991 Meeting.

Cockerill et al., "Depressed Index Cladding Graded Barrier Separate Confinement Single Quantum Well Heterostructure Laser", Applied Physics Letters, vol. 59, 2694, 1991 (Nov.).

Aiki et al, "GaAs-AlGaAs Distributed-Feedback Diode Lasers With Separate Optical and Carrier Confinement", Applied Physics Letter, vol. 27, pp. 145-146, 1975 (Aug.).

Namizaki et al, "Large-Optical-Cavity GaAs-(GaAl-)As Injection Laser with Low-Loss Distributed Bragg Reflectors", Applied Physics Letters, vol. 31, pp. 122-124, 1977 (Jul.).

Primary Examiner—John D. Lee
Attorney, Agent, or Firm—Raymond L. Owens

[57] ABSTRACT

A ridge waveguide distributed feedback semiconductor laser diode having a depressed-index cladding layer formed on a graded lower cladding layer.

8 Claims, 2 Drawing Sheets

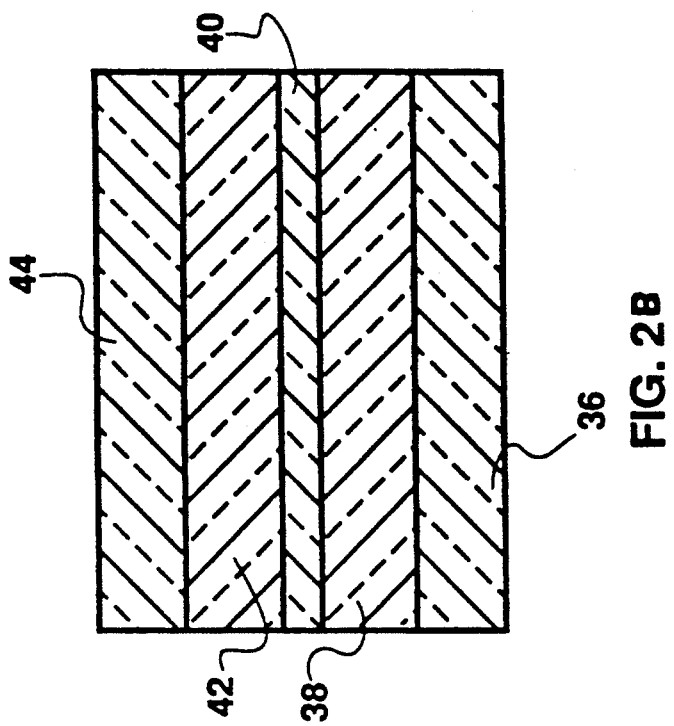
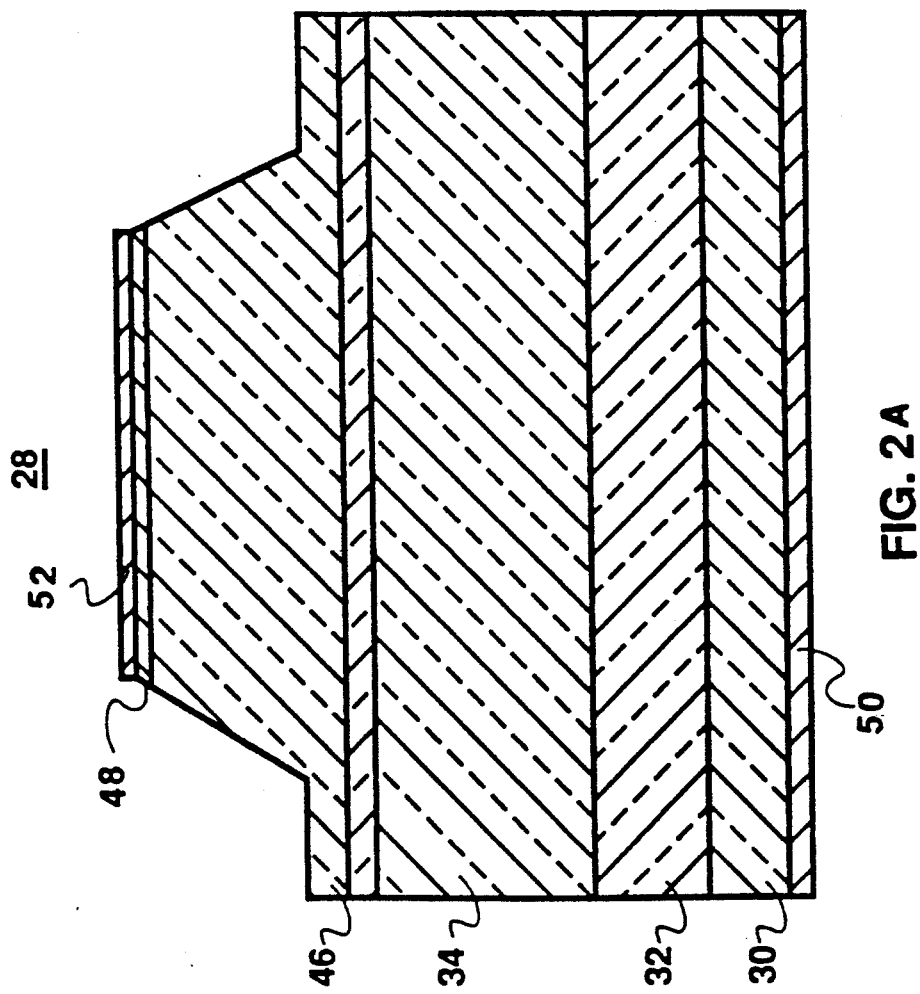

RIDGE WAVEGUIDE DISTRIBUTED-FEEDBACK LASER DIODE WITH A DEPRESSED-INDEX CLADDING LAYER

CROSS-REFERENCE TO RELATED APPLICATIONS

Reference is made to commonly assigned U.S. patent application Ser. No. 07/971,621, filed Nov. 5, 1992, entitled "A Depressed-Index Ridge Waveguide Laser Diode Containing a Stabilizing Region" by Kahen and U.S. patent application Ser. No. 07/971,641 filed Nov. 5, 1992, entitled "Ridge Waveguide Laser Diode With a Depressed-Index Cladding Layer" by K. B. Kahen et al, the teachings of which are incorporated herein by reference.

BACKGROUND OF THE INVENTION

Typically, semiconductor laser diodes (Fabry-Perot laser diodes) are stable at a particular wavelength over a very narrow range of temperatures, i.e., approximately a few degrees. The reason for this instability is that adjacent longitudinal modes all have approximately the same net threshold gain (lasers operate at the wavelength with the smallest net threshold gain) In order to circumvent this problem, laser diodes have been developed which favor longitudinal modes of specific wavelengths. These types of laser diodes are generically called, frequency-stabilized laser (FSL) diodes. The two main types of FSL diodes are distributed-feedback (DFB) laser diodes (K. Aiki et al.,'*GaAs-AlGaAs distributed-feedback diode lasers with separate optical and carrier confinement,*' Appl. Phys. Lett., vol. 27, pp. 145–146, 1975) and distributed Bragg reflector (DBR) laser diodes (H. Namazaki, M. K. Shams, and S. Wang, '*Large-optical-cavity GaAs- (GaAl)As injection laser with low-loss distributed Bragg reflectors,*' Appl. Phys. Lett., vol. 31, pp. 122–124, 1977). The basic operating principle of these laser diodes is that for a very narrow range of wavelengths (called DFB modes) adjacent to the Bragg wavelength, $\lambda_B$ optical feedback is provided not only by the end-facet mirrors (as for the Fabry-Perot modes), but also by a periodic variation of the index of refraction along the longitudinal length of the laser. Accordingly, wavelengths near $\lambda_B$ have smaller losses than the out-of-phase Fabry-Perot modes, resulting in DFB laser diodes exhibiting a wavelength stability on the order of 50° C. Frequency-stabilized laser diodes are particularly useful for applications such as fiber-optic communications, where wavelength stability reduces unwanted chirping effects and enables the lasers to operate at higher bit rates, and optical recording, where wavelength stability reduces the effect of optical feedback from the recording media.

For systems applications, the laser diode's output is typically coupled either to optical fibers or recording media. In order to maximize the coupling, it is desirable that the beam be circular. The shape of the output beam can be described in terms of the far-field beam divergence ratio $\rho = \theta_t/\theta_l$, where $\theta_t$ and $\theta_l$ are the far-field divergences in the planes perpendicular and parallel to the laser junction, respectively. Typical DFB laser diodes have beam divergence ratios on the order of 4.0. Recently, there has been some activity devoted to designing non-frequency stabilized laser diodes with more circular output beams. Both Yuri et al. (M. Yuri, A. Noma, I. Ohta, and M. Kazumura, '*Reduction of beam divergence angles perpendicular to the junction planes by modulating the refractive index profile in AlGaAs laser diodes*', presented at the Fall 1991 meeting of the Japanese Society of Applied Physics) and Cockerill et al. (T. Cockerill, J. Honig, T. DeTemple, and J. Coleman, '*Depressed index cladding graded barrier separate confinement single quantum well heterostructure laser,*'Appl. Phys. Lett., vol. 59,2694, 1991) have introduced depressed-index cladding layers into their Fabry-Perot laser diodes to significantly lower $\theta_t$ and therefore, $\rho$. A schematic of an AlGaAs-based laser diode containing these layers in shown in FIG. 1. In the figure is indicated the Al content of the various layers, where 10 refers to the n+-GaAs substrate. On the surface of 10 is formed the lower cladding layer 12. Upon 12 is deposited the lower depressed-index cladding layer 14. The index of refraction of this layer is smaller than that of the surrounding layers since the index of refraction of AlGaAs materials is smallest for pure AlAs. On the surface of 14 is formed the lower spacer layer 16, followed by the active layer 18 and the upper spacer layer 20. Upon 20 is formed the upper depressed-index cladding layer 22 followed by the upper cladding layer 24. Lastly, upon the surface of 24 is formed the capping layer 26. Since light avoids low-index regions, the physical effect of the inclusion of the depressed-index cladding layers is to push the transverse-confined waveguide mode both toward the middle and ends of the structure. With greater light intensity present in the upper and lower cladding layers, $\theta_t$ decreases as desired. $\Gamma$ remains approximately stationary since light is also pushed towards the middle (active layer) of the structure. More specifically, Cockerill et al. determined that for a broad-area graded-index separate confinement heterostructure device, $\theta_t$ was 27° and 59° for structures with and without the inclusion of the depressed-index cladding layers, respectively.

From the above discussion, it is highly desirable to combine frequency stabilization and small transverse beam divergence. Based on manufacturability considerations, it is also desirable to use a ridge waveguide design for obtaining lateral confinement. However, there are problems inherent in combining DFB frequency stabilization with conventional depressed-index cladding structures. In order to obtain the desired redistribution of the modal-field, the depressed-index cladding layers are typically placed adjacent to the active layer. As a result the modal field surrounding the active layer is significantly reduced compared to its value in the absence of depressed-index layers. Consequently, the interaction of the field with both the DFB grating and the rib is weakened, resulting in smaller coupling coefficients and poor lateral confinement. Also, in general, structures employing depressed-index cladding layers can develop instabilities in the modal-field as a function of rib-etch depth.

SUMMARY OF THE INVENTION

An object of this invention is to provide an improved distributed-feedback semiconductor laser diode.

This object is achieved in a ridge waveguide distributed-feedback semiconductor laser diode comprising:

(a) a semiconductor substrate of a first conductivity type;

(b) a lower cladding layer of such first conductivity type deposited on the semiconductor substrate;

(c) a depressed-index cladding layer of such first conductivity type formed on the lower cladding layer;

(d) a spacer layer of such first conductivity type deposited on the depressed-index cladding layer;

(e) a semiconductor active layer formed on the spacer layer;

(f) a barrier layer of a second conductivity type deposited on the semiconductor active layer;

(g) a grating layer of such second conductivity type deposited on the barrier layer, (h) an upper cladding layer of such second conductivity type deposited on the grating layer;

(i) a capping layer of such second conductivity type formed on the upper cladding layer;

(j) a rib structure etched into the capping and upper cladding layers so as to provide lateral guiding; and (k) electrically conductive layers formed on the substrate and capping layers.

Frequency stabilization and small transverse beam divergence are combined by employing a depressed-index cladding layer, particularly located with respect to the active layer as set forth above, in a ridge waveguide DFB laser diode structure. Accordingly, enhanced modal-field interactions are provided with the grating layer and rib structure, resulting in large coupling coefficient values and strong lateral waveguiding.

BRIEF DESCRIPTION OF THE DRAWINGS

FIG 2a shows in cross-section a laser diode in accordance with the invention, and FIG. 2b shows an exploded portion of the laser diode in FIG. 2a.

DETAILED DESCRIPTION OF THE PREFERRED EMBODIMENTS

Figure 1:
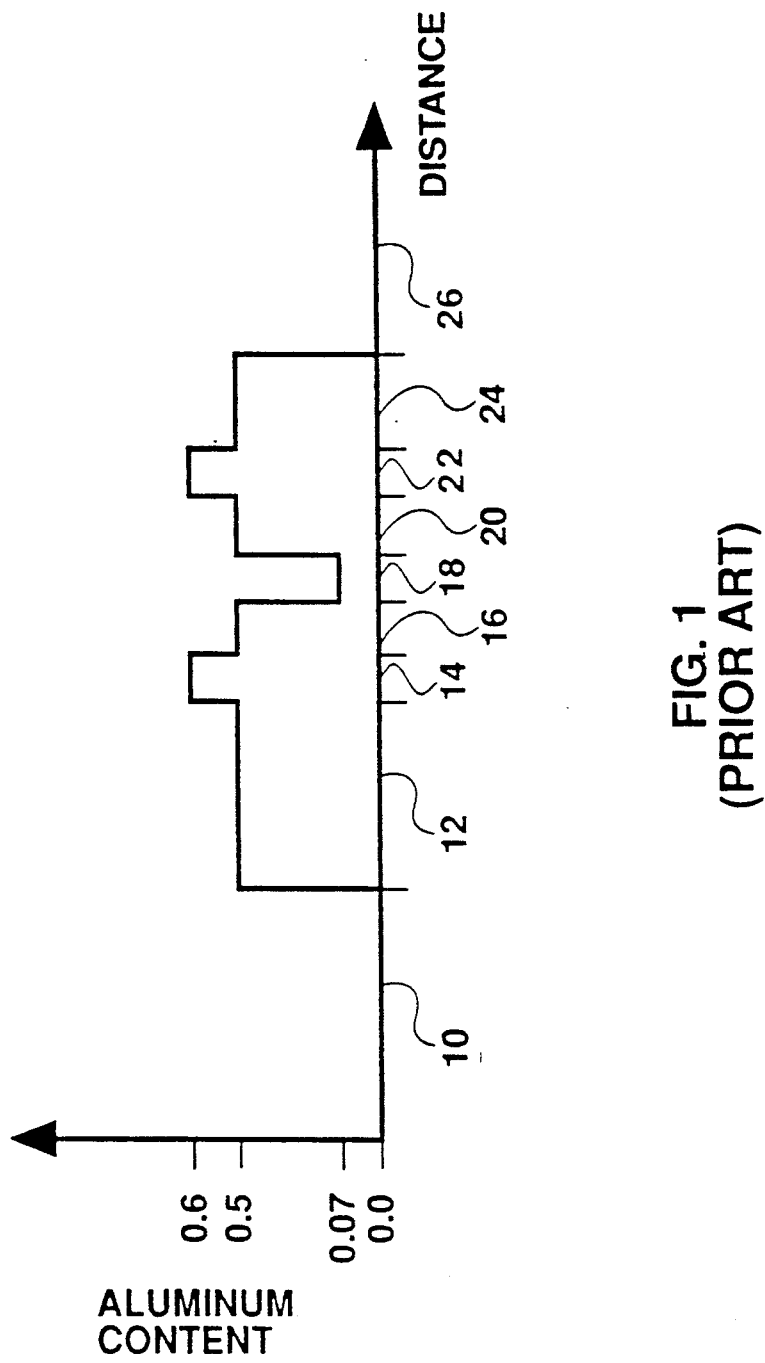
FIG. 1 shows a graph of Al content versus distance in a prior art structure.

According to a preferred embodiment, a depressed-indexcladding, distributed-feedback, ridge waveguide (DIC-DFB RW) laser diode is formed with the desired qualities of frequency stabilization and a small farfield beam divergence ratio.

In accordance with this invention, FIG. 2a shows a stabilized DIC-DFB RW laser diode 28 in which the substrate 30 is highly doped $n^+$-GaAs. In general, the substrate does not need to be composed of $n^+$-GaAs. It can be composed of any highly conductive semiconductive material as long as the remaining layers can be grown epitaxially upon it. The remaining sections of the stabilized DIC-DFB RW laser diode are comprised of a series of individual semiconductive layers of predetermined thicknesses and doping types, arranged epitaxially on the substrate 30, with ohmic metal contacts 50 and 52 located at the bottom and top of the stabilized DIC-DFB RW laser diode 28, respectively. Finally, the longitudinal length of the DIC-DFB RW laser diode is typically from 200 to 600 $\mu$m, and in the preferred embodiment, 300 $\mu$m.

Upon the $n^+$-GaAs substrate 30 is grown a depressed-index buffer layer 32, having a nominal thickness of 1.0 $\mu$m commonly-assigned U.S. patent application Ser. No. 923,763 filed Aug. 3, 1992 to T. Hayakawa entitled "Laser Diode". In the preferred embodiment the depressed-index buffer layer is comprised of n-type $Al_{0.45}Ga_{0.55}As$, although AlGaAs of other compositions and dopant types are possible. In addition, the depressed-index buffer layer can be comprised of materials from other semiconductive systems as long as they grow epitaxially on the substrate and its refractive index is smaller than that of the lower cladding layer. By incorporating a low index material adjacent to the substrate, the modal intensity becomes negligible inside of the substrate, effectively minimizing substrate absorption losses. The depressed-index buffer layer 32 is doped n-type with materials, such as, Si or Sn, to a concentration from $10^{17}$ to $10^{19}$ atoms/cm$^3$, with a preferred density of $5 \times 10^{17}$ atoms/cm$^3$. The preferred method of deposition is Molecular Beam Epitaxy (MBE) or Metal Organic Chemical Vapor Deposition (MOCVD); but, as is practiced in the art, many other methods of deposition, (e.g., Chemical Beam Epitaxy, Liquid Phase Epitaxy, or Atomic Layer Epitaxy) which accomplish epitaxial layers of controlled thicknesses and dopings, may be equally employed.

Upon the depressed-index buffer layer 32 is grown a graded lower cladding layer 34, having a nominal thickness of 2.0 $\mu$m. Since the index of refraction of AlGaAs decreases with increasing Al content, in the preferred embodiment the Al content of the layer is lowest at the endpoints, $Al_{0.40}Ga_{0.60}As$, and linearly grades to $Al_{0.43}Ga_{0.57}As$ at its midpoint. The layer is uniformly doped n-type to a density of $5 \times 10^{17}$ atoms/cm$^3$. Other compositions and material systems are possible as long as the layer can be grown epitaxially and its index of refraction can be smoothly varied. Since light avoids regions of low index of refraction, by grading the index the modal field is prevented from oscillating within the lower cladding layer, minimizing the field's instabilities as a function of rib etch depth.

Referring now to FIG. 2b, on the surface of layer 34 is formed a lower depressed-index cladding layer 36. For the preferred embodiment its composition is n-$Al_{0.66}Ga_{0.34}As$, having a thickness of 0.09 $\mu$m and a doping density of $5 \times 10^{17}$ atoms/cm$^3$. Other compositions and material systems are possible as long as the layer can be grown epitaxially and its refractive index is at least 5% smaller than that of the lower cladding layer. The amount of reduction in the transverse farfield divergence is mainly determined by the thickness and refractive index of the lower depressed-index cladding layer, its position relative to that of the active layer, and the refractive index grading of the graded lower cladding layer. Hence, the preferred embodiment results in one value for $\theta_t$, while other possibilities are attainable by suitably adjusting the above four parameters. The relative position of the lower depressed-index cladding layer is determined by the thickness of a spacer layer 38, which is formed on the layer 36. In the preferred embodiment its composition is n-$Al_{0.40}Ga_{0.60}As$, having a thickness of 0.09 $\mu$m and a doping density of $5 \times 10^{17}$ atoms/cm$^3$. It is desirable to have its composition and doping the same as that of the graded lower cladding layer at its endpoints.

In an active layer 40 (formed on layer 38) light is produced as a result of the recombination of electrons and holes injected from the spacer and barrier layers, respectively. Typically, the active layer 40 is composed of GaAs, having thicknesses ranging from 100 to 1000 Å. In the preferred embodiment the active layer is composed of $Al_{0.12}Ga_{0.88}As$, having a thickness is 0.05 $\mu$m. The composition is chosen for applications in optical recording, where a wavelength of 785 nm is preferable. However, in general, the active layer can be formed of other AlGaAs compositions or semiconductive materials, such as InGaAs, whose band gap is chosen to be smaller than that of the materials in the surrounding layers. In order to obtain a reasonable confinement factor, Γ, small active layer thicknesses (single quantum well) are impractical, resulting in choosing a bulk thickness of 500 Å. Instead of a single bulk layer, another possibility is comprising the active layer of multiple quantum wells, as is commonly practiced in the art. The preferred method of growth of the active layer is also MBE or MOCVD, but other methods which achieve epitaxial materials of high crystallographic quality would also be acceptable. The doping of the active layer lies typically in the range from 0 to $10^{17}$ dopant atoms/cm$^3$, preferably on the order of $10^{16}$ atoms/cm$^3$; and may be of either dopant type, preferably n-type.

Upon layer 40 is formed a barrier layer, 42, which typically has been employed so as to distance the grating layer from the active layer. In the preferred embodiment the barrier layer is 0.1 μm p-$Al_{0.40}Ga_{0.60}As$. Other compositions and material systems are possible as long as the layer can be grown epitaxially and its band gap is larger than that of the active and grating layers. The barrier layer is doped p-type with materials, such as, C, Be, or Zn, to a concentration from $10^{17}$ to $10^{19}$ atoms/cm$^3$, with a preferred density of $2 \times 10^{17}$ atoms/cm$^3$.

Upon the barrier layer 42 is formed a grating layer 44. In the preferred embodiment the grating layer is 0.1 μm p-$Al_{0.36}Ga_{0.64}As$, having a doping density of $2 \times 10^{17}$ atoms/cm$^3$. Other compositions and material systems are possible as long as the layer can be grown epitaxially. Following deposition of the layer 44, a second-order grating is formed in the layer. As is common in the art, second-order gratings are defined holographically in photoresist, followed by ion milling or wet or dry chemical etching. In the preferred embodiment, the grating has a period of 2335 Å and a duty cycle from 25 to 35%, preferably 30%. The grating period was chosen in accordance with the active layer composition and would vary for other compositions. Since the grating shape is typically trapezoidal, the duty cycle was chosen to maximize the coupling of light to the grating structure. In order to minimize variations in the coupling coefficient, κ, the grating depth was 0.12 μm, resulting in the formation of a periodic wire structure in the grating layer. Accordingly, the calculated value for κ was 52 cm$^{-1}$. Other grating orders and depths can be used so as to modify the amount of feedback (as determined by κ) between the forward and backward propagating waves. As is well known, the formation of a grating results in the oscillation of the effective index of refraction along the laser diode cavity length, producing an effective distributed mirror for modes adjacent to $\lambda_B$. Hence, for these modes, the modal reflectivity is determined mainly by the distributed mirror and not by the end-facet mirrors. Accordingly, the reflectivity of the distributed mirror can be designed to be greater than that of the end-facet mirrors, resulting in the lowering of the threshold gain for modes adjacent to $\lambda_B$.

On the surface of layer 44 is formed an upper cladding layer 46. For the preferred embodiment its composition is p-$Al_{0.40}Ga_{0.60}As$, having a thickness of 1.55 μm and a doping density of $2 \times 10^{17}$ atoms/cm$^3$. Other compositions and material systems are possible as long as the layer can be grown epitaxially. The upper cladding layer is grown over the grating following the etch step and special techniques, which are well-known in the art, need to be employed in order to obtain a defect-free overgrowth. On layer 46 is formed a p-GaAs capping layer 48, which is typically 0.1 to 0.3 μm and preferably is 0.2 μm. Its doping density is on the order of $10^{19}$ atoms/cm$^3$, preferably $5 \times 10^{19}$ atoms/cm$^3$. To provide electrical contact to the stabilized DIC-DFB RW laser diode, ohmic metals 50 and 52, such as, PdAuGe-Ag-Au and Ti-Pt-Au, respectively, are formed on the substrate and capping layers, respectively. It should be noted that the capping layer can also be n-type, if Zn diffusion is employed to provide electrical contact from the ohmic metal 52 to the upper cladding layer, 46.

In general, semiconductor laser diodes operate effectively by confining the electron-hole and light-intensity distributions to the active layer. In addition to confinement in this, transverse, direction, confinement of both distributions in the perpendicular, lateral, direction is also desired. In the preferred embodiment of FIG. 2, this is obtained by forming a ridge waveguide structure in the capping and upper cladding layers. As is well known to one practiced in the art, this requires etching a mesa in the capping and upper cladding layers, following their deposition and prior to metal deposition. The etching can be performed by either wet (cherrical) or dry (e.g., reactive ion etching) techniques.

In the prefer-red embodiment the rib has a width of 3 μm at the top of the capping layer, with its sidewalls inclined at an angle of ~35° with respect to the vertical. Additionally, the rib etch is terminated 0.2 μm above the grating layer so as to maximize the amount of lateral waveguiding, while being 0.13 μm above the position where the laser begins to transverse mode hop. Using these values results in calculated far-field characteristics for the preferred embodiment of ~21.0° and 9.5° for $\theta_t$ and $\theta_l$, respectively, and therefore a far-field beam divergence ratio of 2.2, a large reduction over values typical for the prior art. It should be noted that other rib widths, etch depths, and side-wall inclinations are possible, where each combination results in slightly different output beam characteristics.

Thus, a frequency-stabilized DIC-DFB RW laser diode is provided that employs both a single depressed-index cladding layer and a graded lower cladding layer to form nearly circular output beams and to minimize output beam fluctuations due to rib etch depth variations. In general, frequency-stabilized laser diodes having nearly circular output beams are highly desirable since they significantly lower the coupling loss of laser end-firing into optical fibers, making optical communications networks more cost-effective. In addition, by virtue of grading the lower cladding layer it becomes possible to improve the reproducibility of the output beam characteristics of DIC-DFB RW laser diodes, thus lowering the cost of manufacturing them relative to unstabilized variations.

ADVANTAGES

By employing a single (lower) depressed-index cladding layer in distributed-feedback laser diodes it becomes possibly to wed the advantages of good output beam characteristics with wavelength stability, both desirable attributes for both optical communications and recording applications. In addition, by grading the lower cladding layer, the laser diodes become more resistant to transverse mode hopping due to rib-etch depth fluctuations, therefore reducing the cost of manufacturing these devices.

The invention has been described in detail with particular reference to certain preferred embodiments thereof, but it will be understood that variations and modifications can be effected within the spirit and scope of the invention.

What is claimed is:

1. A ridge waveguide distributed-feedback semiconductor laser diode comprising;
   (a) a semiconductor substrate of a first conductivity type;
   (b) a lower cladding layer of such first conductivity type deposited on the semiconductor substrate;
   (c) a depressed-index cladding layer of such first conductivity type formed on the lower cladding layer;
   (d) a spacer layer of such first conductivity type deposited on the depressed-index cladding layer;
   (e) a semiconductor active layer formed on the spacer layer;
   (f) a barrier layer of a second conductivity type deposited on the semiconductor active layer;
   (g) a grating layer of such second conductivity type deposited on the barrier layer;
   (h) an upper cladding layer of such second conductivity type deposited on the grating layer;
   (i) a capping layer of such second conductivity type formed on the upper cladding layer;
   (j) a rib structure etched into the capping and upper cladding layers so as to provide lateral guiding; and
   (k) electrically conductive layers formed on the substrate and capping layers.

2. The ridge waveguide distributed-feedback semiconductor laser diode of claim 1 in which the conductivity of the substrate is either n- or p-type.

3. The ridge waveguide distributed-feedback semiconductor laser diode of claim 1 in which the capping layer is n-type and zinc is diffused into the capping and upper cladding layers.

4. The ridge waveguide distributed-feedback semiconductor laser diode of claim 1 in which the semiconductor material system is AlGaAs.

5. The ridge waveguide distributed-feedback semiconductor laser diode of claim 4 in which the semiconductor active layer is composed of InGaAs.

6. The ridge waveguide distributed-feedback semiconductor laser diode of claim 1 in which the semiconductor active layer is composed of multiple-quantum wells.

7. The ridge waveguide distributed-feedback semiconductor laser diode of claim 1 in which a depressed-index buffer layer is inserted between the semiconductor substrate and lower cladding layer.

8. The ridge waveguide distributed-feedback semiconductor laser diode of claim 7 in which the lower cladding layer is graded (index of refraction) in such a way so as to form a stabilizing layer.

* * * * *